(12) United States Patent
Branch et al.

(10) Patent No.: US 11,901,893 B2
(45) Date of Patent: Feb. 13, 2024

(54) APPARATUS AND CONTROL OF A SINGLE OR MULTIPLE SOURCES TO FIRE COUNTERMEASURE EXPENDABLES ON AN AIRCRAFT

(71) Applicant: BAE Systems Information and Electronic Systems Integration Inc., Nashua, NH (US)

(72) Inventors: Jason H. Branch, Round Rock, TX (US); Karl P. Herb, Austin, TX (US); Danny L. Plemons, Austin, TX (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 18/155,208

(22) Filed: Jan. 17, 2023

(65) Prior Publication Data
US 2023/0353153 A1 Nov. 2, 2023

Related U.S. Application Data

(62) Division of application No. 16/888,035, filed on May 29, 2020, now Pat. No. 11,558,056.

(51) Int. Cl.
| | | |
|---|---|---|
| *H03K 19/173* | (2006.01) | |
| *B64D 7/00* | (2006.01) | |
| *F41H 11/02* | (2006.01) | |
| *H03F 3/04* | (2006.01) | |

(52) U.S. Cl.
CPC ............. *H03K 19/173* (2013.01); *B64D 7/00* (2013.01); *F41H 11/02* (2013.01); *H03F 3/04* (2013.01)

(58) Field of Classification Search
CPC ......... H03K 19/173; B64D 7/00; F41H 11/02; H03F 3/04

USPC ....................................................... 89/1.51
See application file for complete search history.

(56) References Cited

U.S. PATENT DOCUMENTS

| | | |
|---|---|---|
| 4,712,477 A | 12/1987 | Aikou et al. |
| 5,117,756 A | 6/1992 | Goffin |
| 6,427,599 B1 | 8/2002 | Posson et al. |
| 7,193,691 B2 | 3/2007 | Weber |
| 7,843,375 B1 | 11/2010 | Rennie et al. |
| 7,899,644 B2 | 3/2011 | Weber et al. |
| 7,943,914 B2 | 5/2011 | Chicklis et al. |
| 8,066,218 B2 | 11/2011 | Rubin |
| 8,371,201 B2 | 2/2013 | Deflumere et al. |
| 8,547,170 B1 | 10/2013 | Stobie et al. |
| 8,629,726 B1 | 1/2014 | Madison |

(Continued)

FOREIGN PATENT DOCUMENTS

| | | |
|---|---|---|
| EP | 2916098 | 9/2015 |
| EP | 2858899 | 1/2019 |

(Continued)

OTHER PUBLICATIONS

International Search Report, PCT/US21/33952, dated Oct. 20, 2021, 13 pages.

*Primary Examiner* — Samir Abdosh
(74) *Attorney, Agent, or Firm* — Scott J. Asmus; Sand, Sebolt & Wernow LPA

(57) ABSTRACT

A sequencer for use with a countermeasure defense system includes an input signal indicative of firing an expendable, a circuit card that receives the input signal indicative of firing the expendable and an output analog signal from the circuit card that fires the expendable. The parameters of the output analog signal correspond to parameters of a digital waveform.

20 Claims, 10 Drawing Sheets

(56) References Cited

U.S. PATENT DOCUMENTS

| | | | |
|---|---|---|---|
| 8,816,268 | B1 | 8/2014 | Stobie |
| 9,448,107 | B2 | 9/2016 | McNeish |
| 10,104,756 | B1 | 10/2018 | Chang et al. |
| 10,473,429 | B1 | 11/2019 | Louchard |
| 2010/0326262 | A1 | 12/2010 | Galanti et al. |
| 2012/0210855 | A1 | 8/2012 | Clark et al. |
| 2013/0082183 | A1 | 4/2013 | Mudge |
| 2015/0331417 | A1 | 11/2015 | Theiss |
| 2016/0209266 | A1 | 7/2016 | McNeish |
| 2017/0214258 | A1 | 7/2017 | Namou et al. |
| 2017/0222397 | A1 | 8/2017 | Tsunoda |
| 2018/0321024 | A1 | 11/2018 | Bickford |

FOREIGN PATENT DOCUMENTS

| | | |
|---|---|---|
| EP | 3508809 | 7/2019 |
| GB | 2519785 | 5/2015 |
| GB | 2571197 | 8/2019 |
| IL | 168502 | 1/2012 |
| IN | 2085DEL2013 | 2/2015 |
| IN | 2369DEL2013 | 4/2016 |
| TR | 201901076 | 2/2019 |
| WO | 2004046750 | 6/2004 |
| WO | 2004109251 | 12/2004 |
| WO | 2005056384 | 6/2005 |
| WO | 2007015698 | 2/2007 |
| WO | 2008027023 | 3/2008 |
| WO | 2011101692 | 8/2011 |
| WO | 2011130779 | 10/2011 |
| WO | 2019135079 | 7/2019 |
| ZA | 201409285 | 9/2016 |

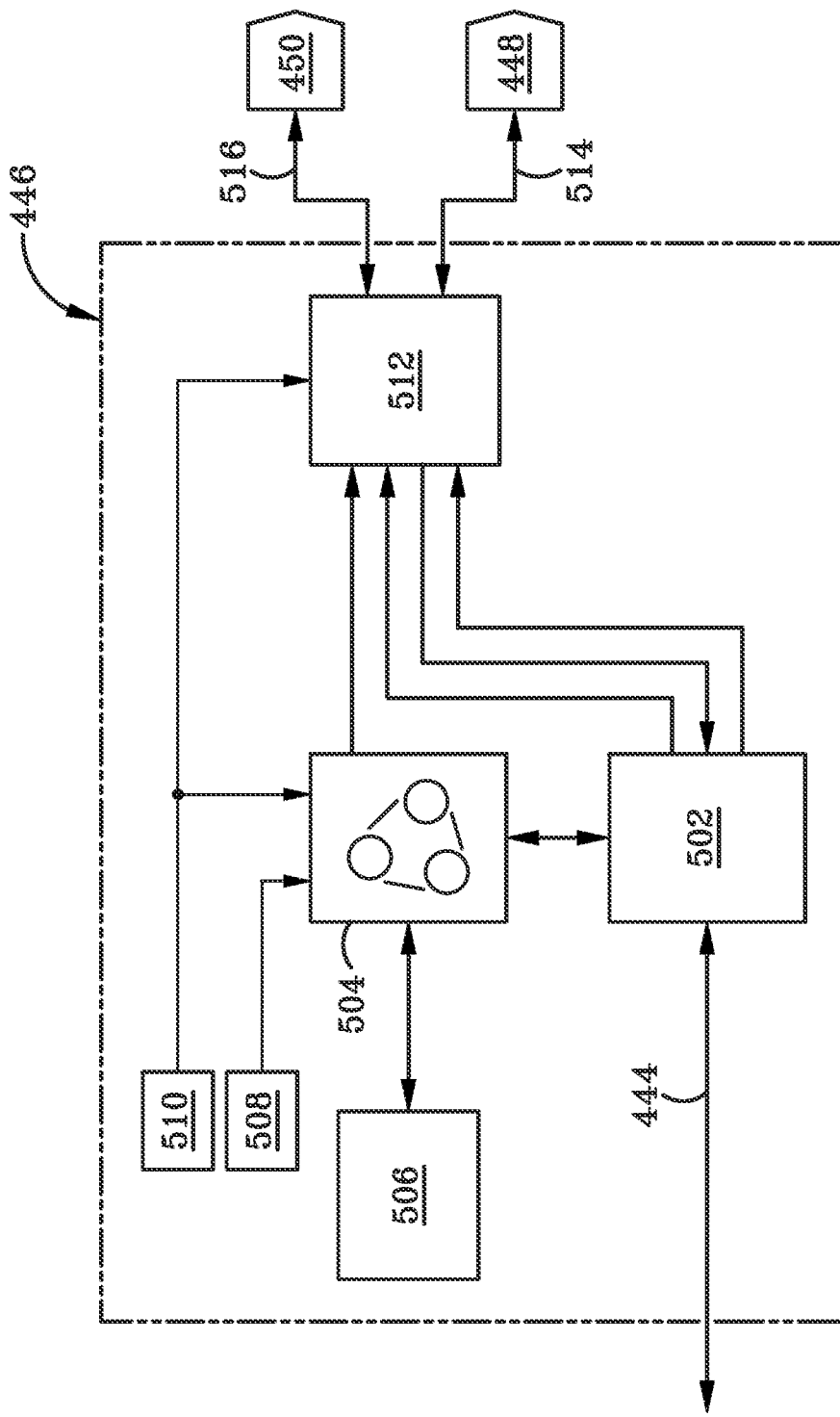

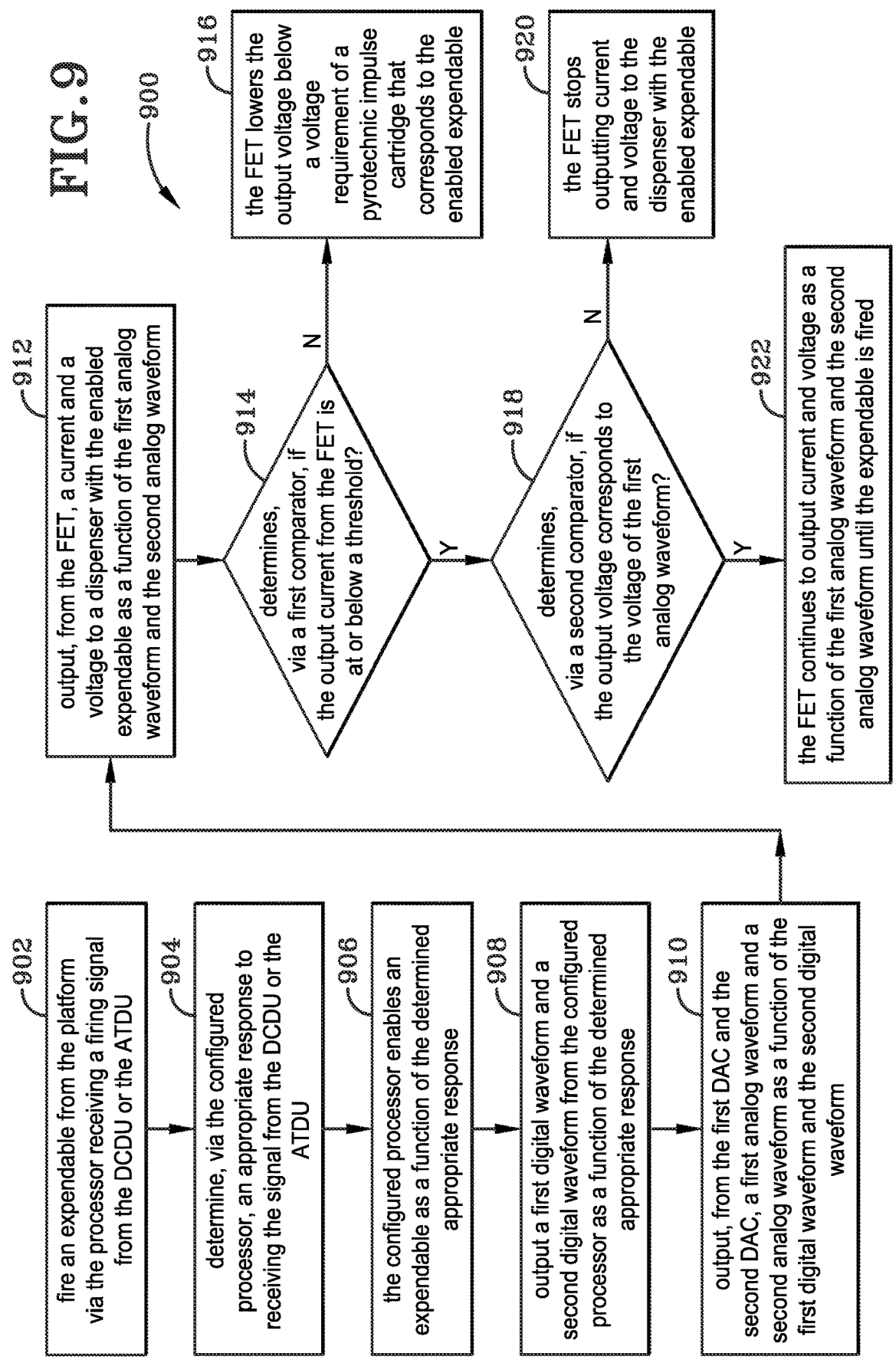

APPARATUS AND CONTROL OF A SINGLE OR MULTIPLE SOURCES TO FIRE COUNTERMEASURE EXPENDABLES ON AN AIRCRAFT

CROSS-REFERENCE TO RELATED APPLICATIONS

The present application is a divisional and claims priority of U.S. application Ser. No. 16/888,035 filed May 29, 2020 and is incorporated by reference for all purposes.

TECHNICAL FIELD

The following generally relates to aircraft defense systems. Specifically, the following relates to a Countermeasure Dispenser System (CMDS). More specifically, the following relates to a system and process for releasing expendables from a CMDS.

BACKGROUND

A CMDS dispenses expendables (i.e., chaff or flares) from a platform such as an aircraft in order to counter an incoming threat. The expendables may be released based on an input from a pilot or may automatically be released based on a threat detection unit interfaced with the CMDS that detects an incoming threat. The CMDS includes a fire source that supplies a current pulse that electrically initiates a pyrotechnic impulse cartridge. The pyrotechnic impulse cartridge is used to dispense chaff or flare expendables from the aircraft. Generally, a CMDS includes at least two fire sources that operate at a duty cycle, such as 50%, limiting the fire rate of expendables. As a result, an aircraft may have available expendables, but may not be able to dispense them during a time of need. Also, different expendables may require different voltages in order to initiate their corresponding pyrotechnic impulse cartridge. A CMDS may be capable of supplying only one current to a pyrotechnic impulse cartridge limiting the type of expendable the CMDS may be capable of firing. Furthermore, a CMDS may be susceptible to undesired fire pulse that may electrically initiate a pyrotechnic impulse cartridge thereby causing a misfire.

SUMMARY

Modern threats require more than two fire sources that operate at a higher duty cycle in order to fire expendables at a higher rate and further require a CMDS that is adaptable to different payloads that require different firing voltages. Thus, there is a continuous unmet need for a CMDS that includes more than two adaptable fire sources that operate at a higher than 50% duty cycle. There is also a continuous unmet need for a safer CMDS that is less susceptible to misfire due to an undesired fire pulse reaching a pyrotechnic impulse cartridge. Aspects of the present disclosure are directed to these continuous unmet needs.

In one aspect, an exemplary embodiment of the present disclosure may provide a sequencer for use with a countermeasure defense system of platform such as an aircraft. As used herein, aircraft includes helicopters, UAV's, planes and the like. In a further example, the platform includes maritime and land based assets. The sequencer may include an input signal indicative of firing an expendable. The sequencer may further include a circuit card that receives the input signal indicative of firing the expendable. The sequencer may further include an output analog signal from the circuit card assembly that fires the expendable, wherein parameters of the output analog signal correspond to parameters of a digital waveform. This exemplary embodiment or another exemplary embodiment may provide a memory of the circuitry card wherein the parameters of the digital waveform are stored within the memory of the circuit card. This exemplary embodiment or another exemplary embodiment may provide wherein the parameters of the digital waveform are user programmable. This exemplary embodiment or another exemplary embodiment may provide wherein the parameters of the digital waveform include a user programmable rise time and user programmable fall time.

This exemplary embodiment or another exemplary embodiment may provide wherein the parameters of the digital waveform include a user programmable pulse cycle. This exemplary embodiment or another exemplary embodiment may provide a first MUX connected to a first expendable; and a second MUX connected to a second expendable, wherein the first MUX outputs a first analog signal that fires the first expendable and the second MUX outputs a second analog signal that fires the second expendable, and wherein parameters of the first analog signal correspond to a first digital waveform and parameters of the second analog signal correspond to a second digital waveform. This exemplary embodiment or another exemplary embodiment may provide wherein the parameters of the first analog signal correspond to a firing requirement of the first expendable and the parameters of the second analog signal correspond to a firing requirement of the second expendable, and wherein the first expendable and the second expendable are different. This exemplary embodiment or another exemplary embodiment may provide wherein the second MUX outputs the second analog signal immediately after the first MUX outputs the first analog signal.

This exemplary embodiment or another exemplary embodiment may provide first MUX connected to first expendable; a second MUX connected to a second expendable; a third MUX connected to a third expendable; and a fourth MUX connected to a fourth expendable, wherein the first MUX, the second MUX, the third MUX, and the fourth MUX simultaneously output an analog signal that simultaneously fire the first expendable, the second expendable, the third expendable, and the fourth expendable. This exemplary embodiment or another exemplary embodiment may provide an amplifier that compares an output current of the sequencer unit to a threshold. This exemplary embodiment or another exemplary embodiment may provide an amplifier that determines if an output voltage of the sequencer corresponds to a voltage parameter of the analog signals.

In another aspect, an exemplary embodiment of the present disclosure may provide a method for fifing an expendable countermeasure from a platform such as an aircraft. The method may include receiving an input indicative of firing an expendable countermeasure with a circuit card. The method may further include generating, with the circuit card, a digital waveform as a function of the input. The method may further include generating, with the circuit card, an analog waveform as a function of the digital waveform. The method may further include firing the expendable countermeasure as a function of the analog waveform. This exemplary embodiment or another exemplary embodiment may provide firing at several countermeasures simultaneously. This exemplary embodiment or another exemplary embodiment may provide retrieving, with a programmable logic device of the circuit card, at least one parameter of a digital waveform from a memory of the programmable logic device; and generating the digital waveform as a function of the at least one parameter.

This exemplary embodiment or another exemplary embodiment may provide wherein that at least one parameter is defined by a user or operator. This exemplary embodiment or another exemplary embodiment may provide wherein at least one parameter is a rise time, fall time, or a pulse cycle of the digital waveform. This exemplary embodiment or another exemplary embodiment may provide outputting, with the circuit card, a voltage to the countermeasure; determining the output voltage corresponds to a voltage parameter of the analog waveform; and in response to determining the output voltage corresponds to the voltage parameter, firing the expendable countermeasure. This exemplary embodiment or another exemplary embodiment may provide outputting, with the circuit card, a voltage to the expendable countermeasure; determining the output voltage corresponds to a voltage parameter of the analog waveform; and in response to determining the output voltage does not correspond to the voltage parameter, reducing the output voltage to the expendable countermeasure.

In yet another aspect, an exemplary embodiment of the present disclosure may provide a method for changing a countermeasure defense system of a platform. The method may include removing a legacy first sequencer of the countermeasure defense system from the platform. The method may further include installing a second sequencer that is user programmable into the countermeasure defense system of the platform. This exemplary embodiment or another exemplary embodiment may provide wherein installing the second sequencer enables the aircraft to fire at least four expendables simultaneously or enables the aircraft to fire multiple expendables sequentially without a period of time between firing each expendable. The sequencer has a total of eight fire sources. Four for each dispenser to which it is attached. The limit is associated with two constraints. The first being power. Each fire source provides up to five amps to ignite the squib. Thermal operating environment limits the amount of power we can dissipate of the operational temperature range. Secondly, The platform structural design implementation limits the number if simultaneous dispenses due to the reaction forces associated with dispensing the expendables. In one example, countermeasure defense system may have eight independent fire source. There may be up to eight expendables the can be dispensed simultaneously independent of the expendable type (e.g., chaff, flare, etc.)

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

FIG. 5 (FIG. 5) depicts a programmable logic device of the sequencer of FIG. 4A.

FIG. 9 (FIG. 9) depicts a process or system for automatically dispensing an expendable from a platform.

Similar numbers refer to similar parts throughout the drawings.

DETAILED DESCRIPTION

Figure 1:
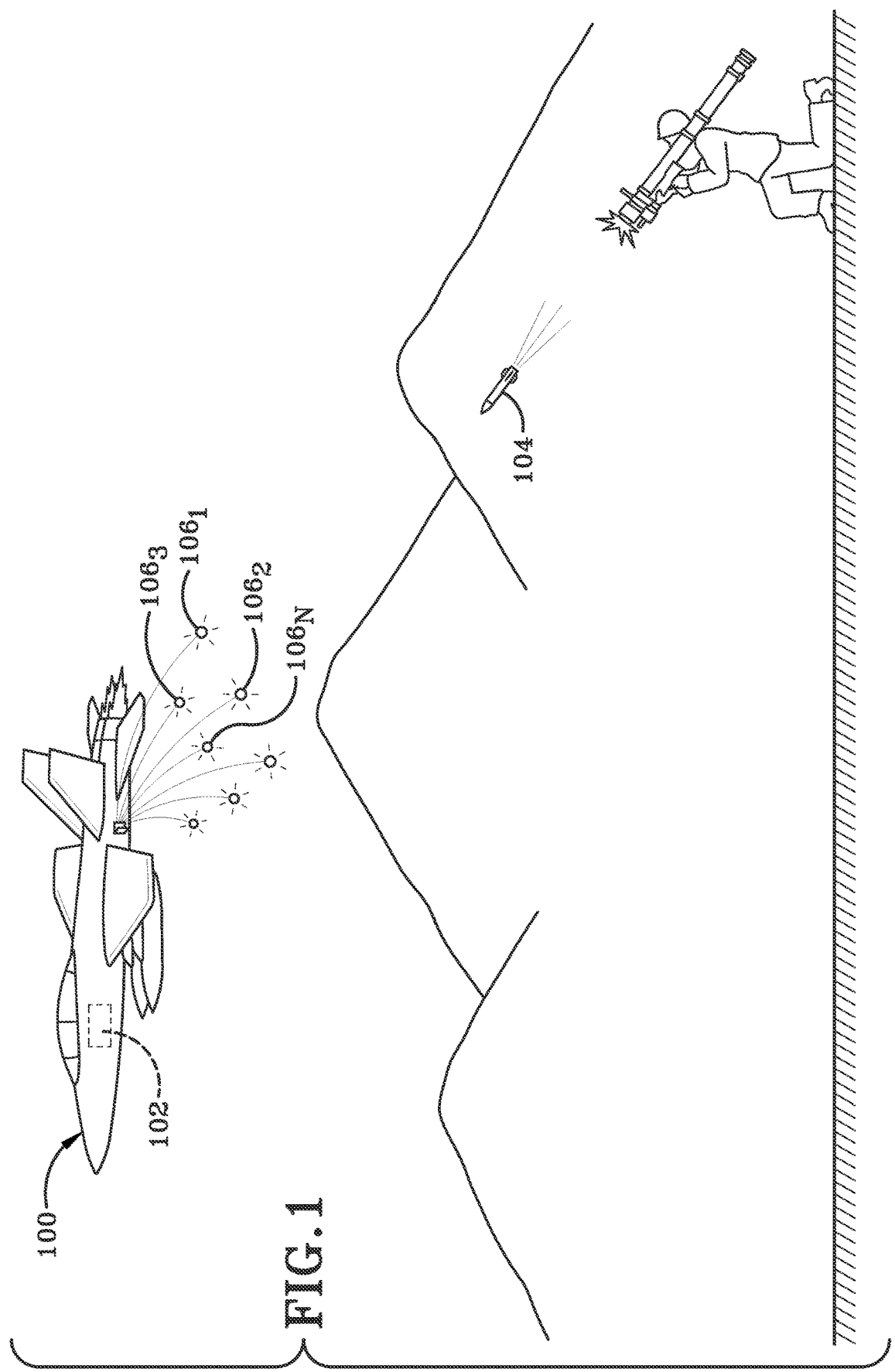
FIG. 1 (FIG. 1) depicts an aircraft dispensing an expendable from a countermeasure defense system in response to a threat.

According to one example, FIG. 1 depicts an platform 100 with a Countermeasure Dispenser System (CMDS). 102. The platform 100 in one example includes some form of radar warning receivers as part of a threat warning system and other electronic warfare sensors for platform survivability involving threats to the platform 100. In one example, the radar warning receiver and other sensors detects the threat. It operates as a threat warning system and provides a signal to the CMDS to take some action such as launching chaff and/or flares to provide RF and IR countermeasures.

When a threat 104 is detected by the platform 100, the CMDS 102 may launch a plurality of expendables 106 depending upon the threat. In one example, as depicted in FIG. 1, the CMDS 102 may launch a plurality such as at least three expendables 106 including a first expendable $106_1$, a second expendable $106_2$, ..., and an N expendable 106. While the CMDS 102 is depicted as launching at least three expendables 106, it is understood that the CMDS 102 may launch any number of expendables 106. While the threat 104 in this example is depicted as a missile, the threat 104 may include other types of threats such as rockets, rocket propelled grenade, drone, and even a radar detection signal or jamming signal.

The expendables 106 in one example include chaff and/or flares. Chaff may be used to reflect an incoming radar signal in order to temporarily hide or confuse the whereabouts or characteristics of the platform 100. Flares, when dispensed, ignite behind the platform such as an platform 100 and may attract a heat seeking missile thereby diverting the missile from the aircraft. The platform 100 may also engage in evasive maneuvers in combination with the launch of the expendables 106 as well as other countermeasure such as laser jamming.

Figure 2:
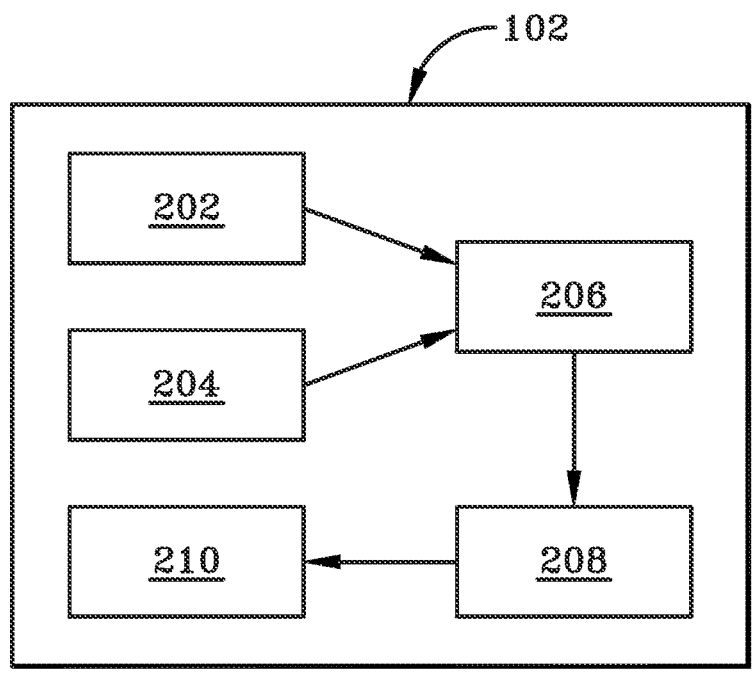
FIG. 2 (FIG. 2) depicts the countermeasure defense system of FIG. 1 including a sequencer unit and a dispenser unit.

FIG. 2 depicts a further example of the platform with the CMDS 102. The CMDS 102 in one example includes an interface to a Digital Control Display Unit (DCDU) 202, and there is a threat warning system also referred to as an automatic threat detection unit (ATDU) 204. A radar warning receiver and other sensors (not shown) provide information about the threats to the system. The CMDS 102 is one system within an integrated self-protection systems. The CMDS 102 receives threat information from platform sensors (e.g. RADAR Warning Receivers, Threat Warning Receivers, etc.) and uses this information combined with information provided by the platform mission system (including NAV Data, Role, Pitch and Yaw rates, etc.) to dispense the optimum time sequence of payload types to decoy or intercept the threat system.

The CMDS in one example includes a programmer unit 206, a sequencer unit 208, and a dispenser unit 210. The DCDU 202, the ATDU 204, the programmer unit 206, and the sequencer unit 208 may each include logic that may cause the DCDU 202, the ATDU 204, the programmer unit 206, and the sequencer unit 208 to perform the functions discussed in further detail below.

In one embodiment, the platform 100 may be a legacy aircraft with a legacy CMDS having a legacy sequencer unit. In this embodiment, the legacy sequencer unit may be removed and replaced with a sequencer unit 208 that properly interacts with a legacy dispenser unit of the legacy aircraft and a legacy programmer unit. As such, there is no need to rebuild or contrast a new platform 100 when installing the different sequencer unit 208. However, it is understood that the sequencer unit 208 could be constructed on a new platform 100.

The DCDU 202 in one example provides a cockpit interface for receiving a pilot instruction to dispense expendables 106. The input from the pilot may include a dispensing mode, a payload selection, an emergency jettison selection, etc. In one example, a pilot may fly over a territory with a radar detection system and the pilot may determine it is desirable to hide the aircraft's 100 position from the radar detection system. As such, the pilot may input a command into the DCDU 202 to dispense chaff. In another example, the radar system may alert the pilot and/or the pilot may visually detect an incoming threat such as a drone, rocket or missile. In this example, the pilot may determine it is desirable to release flares to divert the incoming threat from the platform 100. As such, the pilot may input a command into the DCDU 202 to dispense flares. After receiving the input from the pilot, the DCDU 202 may send a first signal indicative of the input to the programmer unit 206.

In one embodiment, the platform 100 uses the ATDU 204 that uses sensors and the radar system to detect one or more threats and devise an automatic or semi-automatic response. In one example, the platform itself may be automated and no operator would be present on the platform to provide inputs although a remote operator might be present. The threat warning system 204 in one example automatically sends commands to the CMDS 102 to take the desired action. In another example the ATDU provides an alert to the pilot The ATDU 204 may include one or more sensors that automatically detect the threat 104. The sensors may include radar detectors adapted to detect an incoming missile. When the ATDU 204 detects the threat 104, the ATDU 204 may send a second signal indicative of the detected threat 104 to the programmer unit 206. For example, if the ATDU 204 detects an incoming missile then the ATDU 204 may send a signal indicative of an incoming missile to the programmer unit 206.

After receiving either the first signal from the DCDU 202 or the second signal from the ATDU 204, the programmer unit 206 may determine an appropriate response as a function of the first signal or the second signal and countermeasure payload availability. After determining the appropriate response, the programmer unit 206 may send a fire signal indicative of the appropriate response to the sequencer unit 208. The signal may include a fire command and a payload type.

In one example, a pilot may determine it is necessary to jettison weight. As such, the pilot may desire to jettison all expendables 106 from the platform 100. Accordingly, the pilot may input a command to jettison all expendables 106 into the DCDU 202. The DCDU 202 may send the first signal indicative of the input to jettison all expendables 106 to the programmer unit 206. The programmer unit 206 may receive the first signal and may determine the only expendables 106 available are flares. As a result, the programmer unit 206 may determine the appropriate response to the pilot input is to dispense all flares. The programmer unit 206 may then send a fire signal to the sequencer unit 208 indicative of the determined appropriate response to dispense all flares.

In another example, the ATDU 204 may automatically detect an incoming missile. As such, the ATDU 204 sends the second signal indicative of an incoming missile to the programmer unit 206. In one instance, the programmer unit 206 may determine the appropriate response is to dispense 8 flares from the platform 100 and may further determine 20 flares remain in the countermeasure payload. Since the number of flares to be dispensed is less than the number of flares remaining in the countermeasure payload, the programmer unit 206 may determine the appropriate response is to dispense 8 flares. The programmer unit 206 may then send the fire signal indicative of the determined appropriate response to dispense 8 flares to the sequencer unit 208.

In another example, the programmer unit 206 may determine the appropriate response is to dispense 8 flares from the platform 100 and may determine 4 flares remain in the countermeasure payload. Since the number of flares to be dispensed is more than the number of flares remaining in the countermeasure payload, the programmer unit 206 may determine the appropriate response is to dispense all of the flares remaining in the countermeasure payload, in this instance 4. The programmer unit 206 may then send a fire signal indicative of the determined appropriate response to dispense 4 flares to the sequencer unit 208.

As will be discussed in further detail herein, after receiving the fire signal from the programmer unit 206, the sequencer unit 208 may process the fire signal into an analog signal or waveform indicative of the fire signal. The sequencer unit 208 may then send the analog signal to the dispenser unit 210 to dispense an expendable 106.

Figure 3:
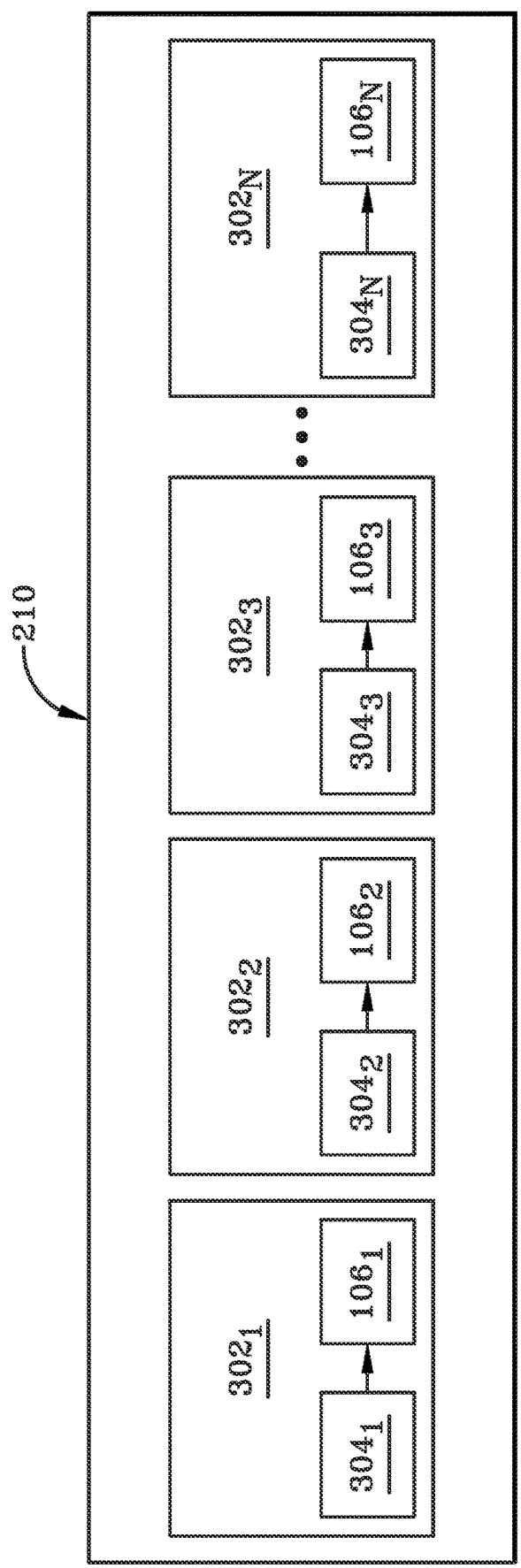
FIG. 3 (FIG. 3) depicts the dispenser unit of FIG. 2.

FIG. 3 depicts the dispenser unit 210. The dispenser unit 210 may include a plurality of dispensers 302. Each dispenser 302 may interface with a pyrotechnic impulse cartridge 304 on an expendable 106. For example, as depicted in FIG. 3, the first dispenser $302_1$ may interface with a first pyrotechnic impulse cartridge $304_1$ on a first expendable $106_1$, a second dispenser $302_2$ may interface with a second pyrotechnic impulse cartridge $304_2$ on a second expendable $106_2$, a third dispenser 3023 may interface with a third pyrotechnic impulse cartridge 3043 on a third expendable $106_3$, . . . , and an N dispenser $302_N$ may interface with an N pyrotechnic impulse cartridge 304N on an N expendable 106N. While FIG. 3 depicts the dispenser unit 210 as interfacing with at least four dispensers 302 each with a pyrotechnic impulse cartridge 304 on an expendable 106, it is understood that the dispenser unit 210 may interface with any number of dispensers 302 with a pyrotechnic impulse cartridge 304 on an expendable 106.

The firing signal from the programmer unit 206 is a command to the sequencer unit 208 may further include an expendable 106 selection for firing. The programmer unit 206 may direct the sequencer unit 208 to select an expendable 106 for firing as a function of the determined appropriate response, expendable 106 availability, and a fire time coordination.

In one example, the programmer unit 206 may command to the sequencer unit to 208 to determine the appropriate response as dispensing two flares. In this example, the dispenser unit 210 may include a first dispenser $302_1$ interfaced with a first expendable $106_1$, a second dispenser $302_2$ interfaced with a second expendable $106_2$, a third dispenser $302_3$ interfaced with a third expendable $106_3$, and a fourth dispenser $302_4$ interfaced with a fourth expendable $106_4$. The first expendable $106_1$ and the second expendable $106_2$ may be flares and the third expendable $106_3$ and the fourth expendable $106_4$ may be chaff. As such, the programmer unit 206 may select the first expendable $106_1$ and the second expendable $106_2$ for firing.

The sequencer unit 208 may command to the sequencer unit 208 to enable an expendable 106 for firing as a function of the firing signal from the programmer unit 206 by creating an electrical connection between the sequencer unit 208 and the expendable 106. Creating the electrical connection allows the sequencer unit 208 to send the analog signal to a corresponding dispenser 302 to electrically initiate a corresponding pyrotechnic impulse cartridge 304 so that the enabled expendable 106 may be dispensed from the platform 100.

In one example, the dispenser unit 210 may include a first dispenser $302_1$ interfaced with a first expendable $106_1$, a second dispenser $302_2$ interfaced with a second expendable $106_2$, a third dispenser $302_3$ interfaced with a third expendable $106_3$, and a fourth dispenser $302_4$ interfaced with a fourth expendable $106_4$. The first expendable $106_1$ and the second expendable $106_2$ may be flares and the third expendable $106_3$ and the fourth expendable $106_4$ may be chaff. In this example, the programmer unit 206 may determine the appropriate response to a threat 104 is to dispense two flares. As such, the firing signal may include selecting the first expendable $106_1$ and the second expendable $106_2$ for firing. As such, the sequencer unit 208 may enable the first expendable $106_1$ and the second expendable $106_2$ for firing by creating an electrical connection between the sequencer unit 208 and the first expendable $106_1$ and the second expendable $106_2$. The sequencer unit 208 may then send the analog signal to the first dispenser $302_1$ and the second dispenser $302_2$ to electrically initiate a first pyrotechnic impulse cartridge $304_1$ and a second pyrotechnic impulse cartridge $304_2$ thereby dispensing the first expendable $106_1$ and the second expendable $106_2$.

Figure 4:
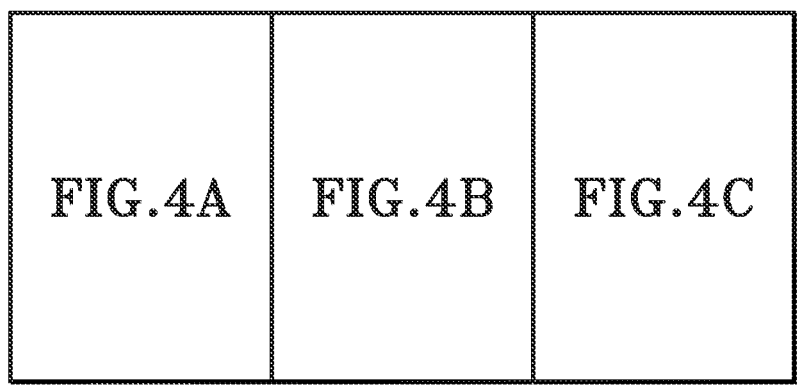
FIG. 4 (FIG. 4) depicts the orientation of FIGS. 4A, 4B, and 4C.
Figure 4A:
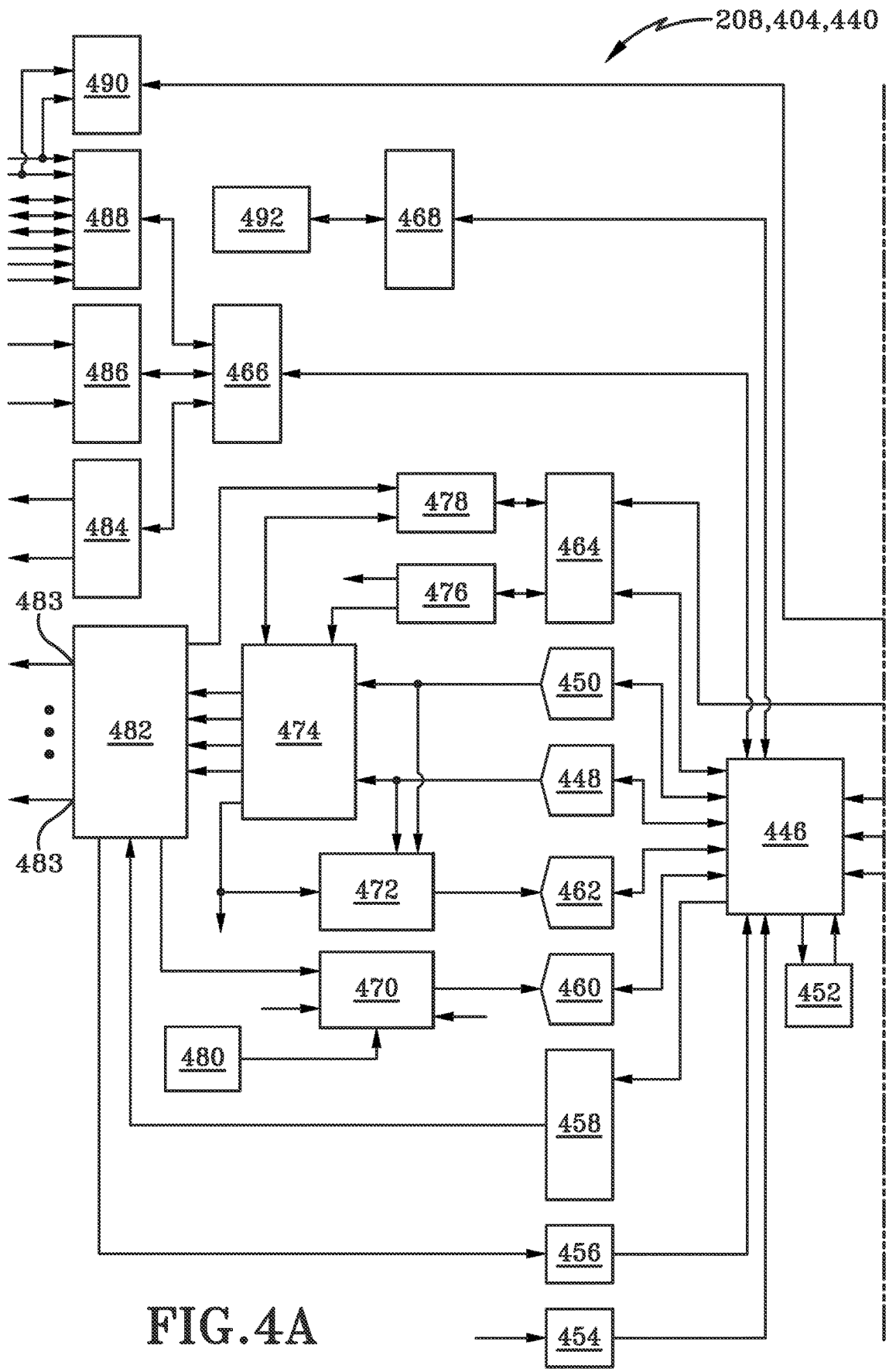
FIG. 4A (FIG. 4A) partially depicts the sequencer unit of FIG. 2.
Figure 4B:
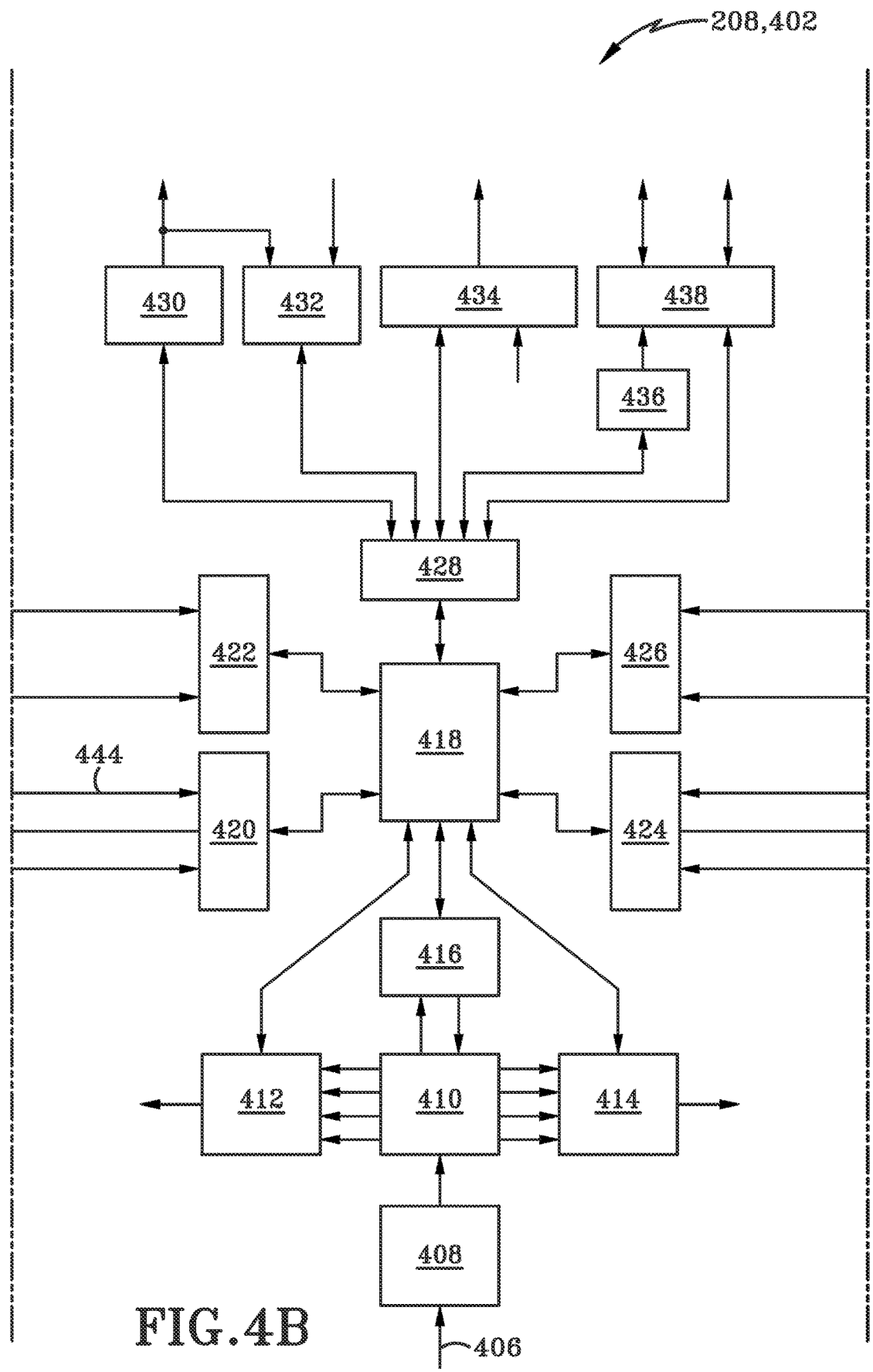
FIG. 4B (FIG. 4B) partially depicts a processer of the sequencer unit of FIG. 2.
Figure 4C:
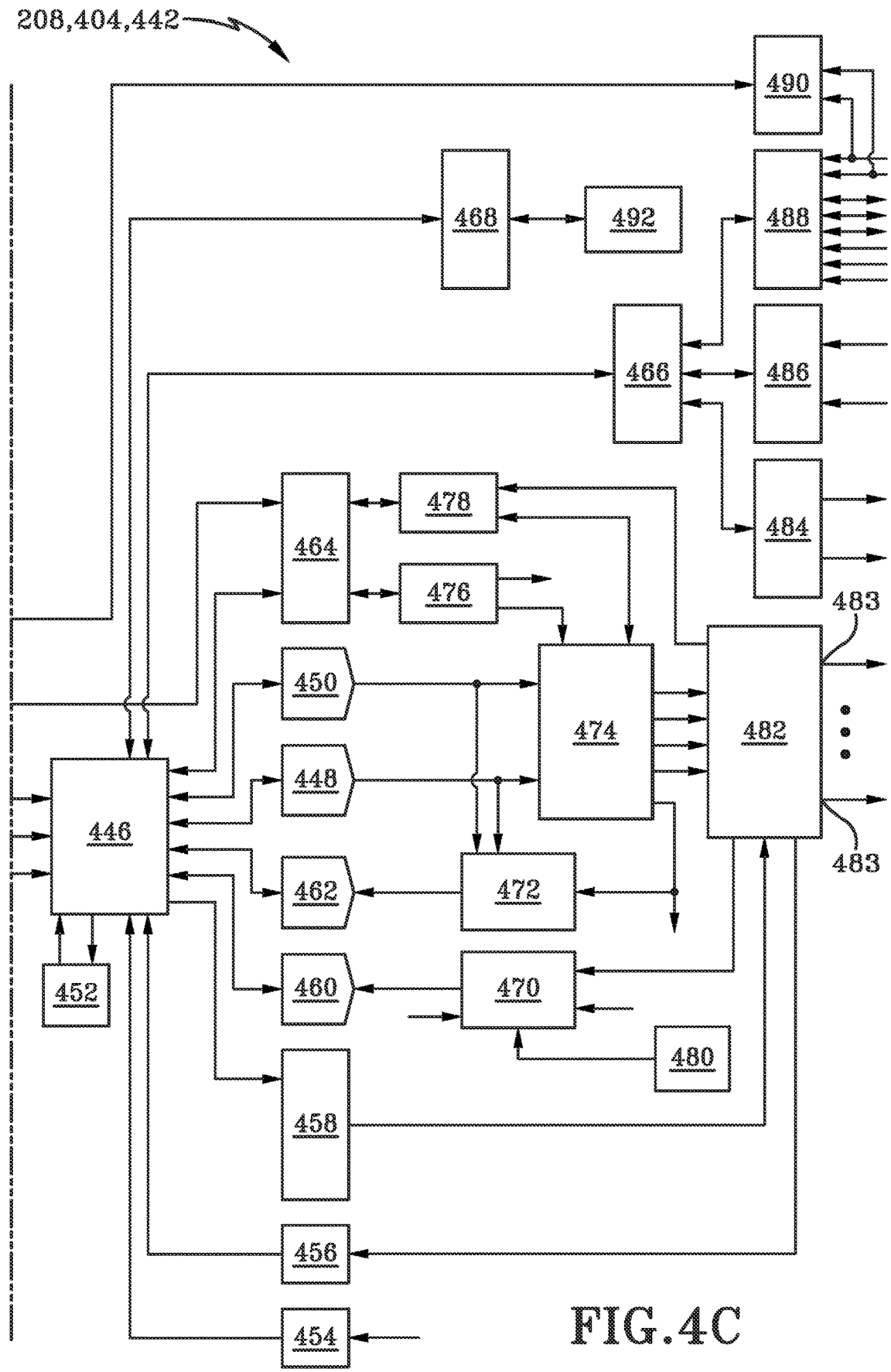
FIG. 4C (FIG. 4C) partially depicts the sequencer of FIG. 2.

FIG. 4 diagrammatically depicts the orientation of FIG. 4A, FIG. 4B, and FIG. 4C. Together, FIG. 4A, FIG. 4B and FIG. 4C depict the sequencer unit 208. The sequencer unit 208 may include a processor circuit card assembly (CCA) 402 and a sequencer CCA 404. As used herein, CCA refers to any form of circuit card such as a printed circuit assembly, printed circuit board assembly and the like.

FIG. 4B depicts the processor CCA 402. The processor CCA 402 may connected to the programmer unit 206 via a sequencer data link (SDL) 406 and may receive the firing signal via the SDL 406. The SDL 406 may include an Ethernet port and may operate at speeds greater than 1 gigabit per second (Gbps) allowing the processor CCA 402 to communicate with the programmer unit 206 at data rates greater than 1 Gbps. In one embodiment, the SDL 406 may meet the requirements of a legacy CMDS already installed on an platform 100. Accordingly, the sequencer unit 208 may be installed on and be backward compatible with a legacy aircraft with a legacy CMDS.

The processor CCA 402 may include a power protector 408 connected to the sequencer data link 406. The power protector 408 is connected to a logic power unit 410. The logic power unit 410 is connected to first power conditioning unit 412, a second power conditioning unit 414, and a microcontroller 416. The first power conditioning unit 412, the second power conditioning unit 414, and the microcontroller 416 are connected to a system on a chip (SoC) 418.

The SoC 418 may include a field programmable array (FPGA) and a processor. The SoC 418 may be in communication with the SDL 406 and may receive the firing signal. The SoC 418 may receive the firing signal and may output a stream of serial messages indicative of the firing signal. The SoC 418 is connected to a first level shift 420, a second level shift 422, a third level shift 424, a fourth level shift 426, and a fifth level shift 428. The first level shift 420 is identical to the third level shift 424 and the second level shift 422 is identical to the fourth level shift 426. The fifth level shift 428 is connected to an H-bridge 430, a discrete-to-digital converter 432, a general next generation power unit 434, a recommended standard-422 (RS-422) unit 436, and a discrete line sharing unit 438. The H-Bridge 430 is connected to the discrete-to-digital converter 432. The discrete line sharing unit 438 is connected to the RS-422 unit 436.

The sequencer CCA 404 may include an A side 440 and a B side 442 that is identical to the A side 440. FIG. 4A depicts the A side 440 and FIG. 4C depicts the B side 442. Reference numerals on the A side 440 identify identical elements on the B side 442. For the sake of brevity, only the A side 440 will be discussed in further detail below.

The sequencer unit 208 may further include a protocol serial bus or an auxiliary (aux) bus 444. The processor CCA 402 may be connected to the sequencer CCA 404 via the aux bus 444. The aux bus 444 may carry the stream of serial messages from the processor CCA 402 to a programmable logic device (PLD) 446 on the A side 440 or the B side 442 of the sequencer CCA 404. As will be discussed in further detail below, when the PLD 446 receives a serial message indicative of a firing signal, the PLD 446 may generate a digital waveform or a pulse waveform. The PLD 446 is connected to a first digital-to-analog converter (DAC) 448 and a second DAC 450 and sends the digital pulse waveform to the first DAC 448 and the second DAC 450. The first DAC 448 converts the digital pulse waveform and outputs a first analog signal that includes a voltage based on the digital pulse waveform and the second DAC 450 converts the digital pulse waveform and outputs a second analog signal that includes a current based on the digital pulse waveform.

The PLD 446 may also be connected to an oscillator 452, a comparator 454, a resistive divider 456, a sixth level shift 458, a first analog-to-digital converter (ADC) 460, a second ADC 462, a seventh level shift 464, an eighth level shift 466, and a ninth level shift 468. The first ADC 460 is connected to a first built-in-test (BIT) multiplexer (MUX) 470. The second ADC 462 is connected to the second BIT MUX 472. The first DAC 448 and the second DAC 450 are connected to the second BIT MUX 472 and a group of fire sources 474.

The group of fire sources 474 includes a number of fire sources (i.e., 2, 4, 6, 8, etc.). In one example, the group of fire sources 474 may include four fire sources. In this example, the group of fire sources 474 includes a first fire source, a second fire source, a third fire source, and a fourth fire source. In another example, the group of fire sources 474 may include six fire sources. In this example, the group of fire sources 474 includes a first fire source, a second fire source, a third fire source, a fourth fire source, a fifth fire source, and a sixth fire source.

The seventh level shift 464 is connected to a poll source 476 and a smart stores communication interface modulation and demodulation unit 478. The second BIT MUX 472, the poll source 476, and the smart stores communication interface modulation and demodulation unit 478 are also connected to the group of fire sources 474. A temperature sensing unit 480 is connected to the first BIT MUX 470. The resistive divider 456, the sixth level shift 458, the first BIT MUX 470, the group of fire sources 474, and the smart stores communication interface modulation and demodulation unit 478 are connected to a group of fire MUX 482. The group of fire MUX 482 includes a number of fire MUX (i.e., 15, 30, 35, etc.).

The number of fire MUX in the group of fire MUX 482 may be dependent upon the number of dispensers 302 as each fire MUX in the group of fire MUX 482 includes an output port 483 that is connected to a dispenser $302_N$. In one example, the dispenser unit 210 may include 60 dispensers 302. In this example, 30 of the dispensers 302 may each be connected to a different fire MUX (for a total of 30 fire MUX) in the group of fire MUX 482 on the A side 440 of the sequencer CCA 404 and 30 of the dispensers 302 may each be connected to a different fire MUX in the group of fire MUX 482 on the B side 442 of the sequencer CCA 404. In another example, the dispenser unit 210 may include 70 dispensers 302. In this example, 35 of the dispensers 302 may each be connected to a different fire MUX in the group of fire MUX 482 on the A side 440 of the sequencer CCA 404 and 35 of the dispensers 302 may each be connected to a different fire MUX in the group of fire MUX 482 on the B side 442 of the sequencer CCA 404.

A set of fire MUX in the group of fire MUX 482 are connected to a fire source in the group of fire sources 474. In one example, the group of fire MUX 482 may include 30 fire MUX and the group of fire sources 474 may include 4 fire sources. In this example, a first set of fire MUX are connected to a first fire source, a second set of fire MUX are connected to a second fire source, a third set of fire MUX are connected to a third fire source, and a fourth set of fire MUX are connected to a fourth fire source. In this example, the first set of fire MUX may include 8 fire MUX, the second set of fire MUX may include 8 fire MUX, the third set of fire MUX may include 7 fire MUX, and the fourth set of fire MUX may include 7 fire MUX. In another example the group of fire MUX 482 may include 40 fire MUX and the group of fire sources 474 may include 5 fire sources. In this example, a first set of fire MUX are connected to a first fire source, a second set of fire MUX are connected to a second fire source, a third set of fire MUX are connected to a third fire source, a fourth set of fire MUX are connected to a fourth fire source, and a fifth set of fire MUX are connected to a fifth fire source. In this example, the first set of fire MUX may include 8 fire MUX, the second set of fire MUX may include 8 fire MUX, the third set of fire MUX may include 8 fire MUX, the fourth set of fire MUX may include 8 fire MUX, and the fifth set of fire MUX may include 8 fire MUX.

The sequencer unit 208 enables the an expendable 106 for firing via a fire source in the group of fire sources 474 and a fire MUX in the group of fire MUX 482. In one example, the group of fire MUX 482 may include a first set of fire MUX connected to a first fire source, a second set of fire MUX connected to a second fire source, a third set of fire MUX connected to a third fire source, and a fourth set of fire MUX connected to a fourth fire source. In this example, the first set of fire MUX include 8 fire MUX numbered 1-8 each connected to a corresponding dispenser $302_1$-$302_8$ with a corresponding expendable $106_1$-$106_8$, the second set of fire MUX include 8 fire MUX numbered 9-16 each connected to a corresponding dispenser $302_9$-$302_{16}$ with a corresponding expendable $106_9$-$106_{16}$, the third set of fire MUX include 7 fire MUX numbered 17-23 each connected to a corresponding dispenser $302_{17}$-$302_{23}$ with a corresponding expendable $106_{17}$-$106_{23}$, and the fourth set of fire MUX include 7 fire MUX numbered 24-30 each connected to a corresponding dispenser $302_{24}$-$302_{30}$ with a corresponding expendable $106_{24}$-$106_{30}$. In this example, the programmer unit 206 may select the expendable $106_{13}$ for firing. As such, the sequencer unit 208 may create an electrical connection to the via the second fire source and the $13^{th}$ fire MUX.

As will be discussed in further detail herein, after enabling an expendable 106 for firing, a fire source provides voltage and current to a corresponding pyrotechnic impulse cartridge 304 to fire the expendable 106. Furthermore, each fire source in the group of fire sources 474 may, at different times or simultaneously, supply voltage and current to a pyrotechnic impulse cartridge 304 to fire an expendable 106 or each fire source may. As such, a CMDS 102 may simultaneously a number of expendables 106 as a function of a number of fire sources within the sequencer unit 208.

In one example, the group of fire sources 474 may contain a first fire source, a second fire source, a third fire source, and a fourth fire source. In this example, the first fire source may fire a first expendable $106_1$, the second fire source may fire a second expendable $106_2$, the third fire source may fire a third expendable $106_3$, and the fourth fire source may fire a fourth expendable $106_4$. As such, the CMDS 102 may fire the first expendable $106_1$, the second expendable $106_2$, the third expendable $106_3$, and the fourth expendable $106_4$ simultaneously.

In another example, the group of fire sources 474 may contain a first fire source, a second fire source, a third fire source, a fifth fire source, and a sixth fire source. In this example, the first fire source may fire a first expendable $106_1$, the second fire source may fire a second expendable $106_2$, the third fire source may fire a third expendable $106_3$, the fourth fire source may fire a fourth expendable $106_4$, the fifth fire source may fire a fifth expendable $106_5$, and the sixth fire source may fire a sixth expendable $106_6$. As such, the CMDS 102 may fire the first expendable $106_1$, the second expendable $106_2$, the third expendable $106_3$, the fourth expendable $106_4$ simultaneously, the fifth expendable $106_5$, and the sixth expendable $106_6$ simultaneously.

As previously discussed, a CMDS of a legacy aircraft may include two fire sources that may or may not be capable of firing simultaneously. Accordingly, when the sequencer unit 208 is installed on a legacy aircraft, the sequencer unit 208 may provide the legacy aircraft with the ability to fire more than two expendables simultaneously.

The eighth level shift 466 is connected to a first input/output (I/O) expander 484, a second I/O expander 486, and a third I/O expander 488. The third I/O expander 488 is connected to a RS-422 unit 490. The ninth level shift 468 is connected to an environmental sensor 492. The second level shift 422 of the processor CCA 402 is connected to the seventh level shift 464 and the RS-422 unit 490.

FIG. 5 depicts the PLD 446. The PLD 446 implements programmable firmware that allows the PLD 446 to control the first DAC 448 and the second DAC 450 to ramp a current of an analog waveform at a desired rate. The PLD 446 may include a firing register 502, a fire engine 504, an edge memory 506, a first timer 508, a second timer 510, and a fire source DAC 512.

The firing register 502 is connected to the aux bus 444 and may receive the stream of serial messages from the SoC 418 via the aux bus 444. The aux bus 444 may write and save the serial messages to the firing register 502. The firing register 502 may monitor the saved serial messages for a change within the saved serial messages indicative of the firing signal.

The fire engine 504 is connected to the edge memory 506. The edge memory 506 may include parameters of a digital pulse waveform. The parameters may include a shape, an edge time (i.e., a voltage rise time to a maximum voltage or a voltage fall time to a minimum voltage), and a pulse cycle or pulse width (i.e., a time the waveform maintains a maximum voltage). These parameters are user programmable, are stored within the edge memory 506, and define parameters of an analog firing pulse waveform that is used to electrically initiate an impulse cartridge 304.

The parameters of the digital waveform are selected to mitigate misfiring due to an undesired waveform (i.e., due to a short in wiring to an expendable 106 or electromagnetic interference (EMI)) electrically initiating a pyrotechnic impulse cartridge 304. The sequencer unit 208 may be installed on a legacy aircraft without the edge memory 506. Legacy aircrafts without the edge memory 506 may not generate analog waveforms that, after processing by a processor, electrically initiate impulse cartridges based on a user programmable digital pulse waveform. These analog waveforms that are used to electrically initiate impulse cartridges of legacy aircrafts may not include parameters that mitigate misfiring. As a result, a legacy aircraft without the sequencer unit 208 may be more susceptible to misfiring than the platform 100 with the sequencer unit 208. Hence, when the sequencer unit 208 is installed on a legacy aircraft, the sequencer unit 208 may provide additional safety features to the legacy aircraft by providing an analog waveform with parameters that mitigate misfiring.

Furthermore, the parameters of the digital pulse waveform may be selected based on an expendable 106 type. For example, a first pyrotechnic impulse cartridge $304_1$ may require a first voltage to fire a first expendable $106_1$ and a second pyrotechnic impulse cartridge $304_2$ may require a second voltage to fire a second expendable $106_2$. In this example, the parameters of a digital waveform used to create an analog waveform to fire the first expendable $106_1$ may include values corresponding to the first voltage and the parameters of a digital waveform used to create an analog waveform to fire the second expendable $106_2$ may include values corresponding to the second voltage. Legacy aircraft without the sequencer unit 208 and the edge memory 506 may only supply a first voltage to a pyrotechnic impulse cartridge 304. As a result, a legacy aircraft without the sequencer unit 208 and the edge memory 506 may be limited in the type of expendable 106 it is capable of firing. Hence, when the sequencer unit 208 is installed on a legacy aircraft, the sequencer unit 208 may provide the legacy aircraft with the ability to fire different expendables 106.

After receiving the first signal from the firing register 502, the fire engine 504 access the edge memory 506 and obtains the digital pulse waveform parameters. The fire engine 504 is further connected to the first timer 508 and the second timer 510. The first timer 508 and the second timer 510 control a digital clock domain of the fire engine 504. The digital clock domain of the fire engine 504 is used to generate values corresponding to the shape, the edge time, and/or the pulse cycle of the digital pulse waveform as a function of the obtained parameters.

The first timer 508 may define the value of the pulse cycle of the digital pulse waveform as a function of the obtained parameters. The value of the digital pulse waveform may be longer than an pulse cycle of an undesired waveform. The first timer 508 may be set to any value (i.e., 1.0 millisecond (ms) 1.5 ms, 2.0 ms, etc.). In one example, the obtained parameters may include a 1 ms pulse cycle. In this example, the first timer 508 may control a digital clock domain of the fire engine 504 to output a 1 ms pulse cycle value. In another example the obtained parameters may include a 2 ms pulse cycle. In this example the first timer 508 may control a digital clock domain of the fire engine 504 to output a 2 ms pulse cycle value.

The second timer 510 may define a time between different voltage values which may be used to define an edge time of a corresponding digital pulse waveform as a function of the obtained parameters. The value of the edge time of the of the digital pulse waveform may be longer than an edge time of an undesired waveform. The second timer 510 may be set to any value (i.e., 5 micro seconds (µs), 10 µs, 15 µs, etc.). In one example the obtained parameters may include a 100 µs rise time and the second timer 510 may be set to 10 µs. In this example, the second timer 510 may control a digital clock domain of the fire engine 504 to output a different voltage value every 10 µs until a 100 µs rise time is achieved. In another example, the obtained parameters may include a 200 µs rise time and the second timer 510 may be set to 5 µs. In this example, the second timer 510 may control a digital clock domain of the fire engine 504 to output a different voltage value every 5 µs until a 200 µs rise time is achieved.

The fire engine 504 is further connected to the fire source DAC 512 and sends the defined values (including edge time and pulse cycle) of the digital pulse waveform to the fire source DAC 512. The fire source DAC 512 is connected to the firing register 502, the fire engine 504, and the second timer 510. The second timer 510 controls a digital clock domain of the fire source DAC 512. The digital clock domain of the fire source DAC 512 may further define the edge time values of the digital pulse waveform. The fire source DAC 512 receives the defined values of the digital pulse waveform from the fire engine 504 and receives values from the firing register 502 to further define the digital pulse waveform. The fire source DAC 512 may read the values back to the firing register 502 and the firing register 502 may further define the values of the digital pulse waveform in response to receiving the read back values from the fire source DAC 512.

After further defining the values of the digital pulse waveform, the fire source DAC 512 generates a first digital pulse waveform and a second digital pulse waveform as a function of the further defined values. The first digital pulse waveform and the second digital pulse waveform include current and voltage values that define current and voltage values of the analog waveform that electrically initiates a pyrotechnic impulse cartridge 304. The fire source DAC 512 is connected to the first DAC 448 via a first serial peripheral interface (SPI) 514, but could extend to any serial or parallel communication interface between integrated circuits. The fire source DAC 512 is also connected to connected to the second DAC 450 via a second SPI 516. The fire source DAC 512 sends the first digital pulse waveform to the first DAC 448 and sends the second digital pulse waveform to the second DAC 450. The first SPI 514 controls the first DAC 448 to output a first analog waveform with a voltage at a given time as a function of the first digital pulse waveform and the second SPI 516 controls the second DAC 450 to output a second analog waveform with a current at a given time as a function of the second digital pulse waveform. The first analog waveform and the second analog waveform are used to fire an enabled expendable 106.

Figure 6:
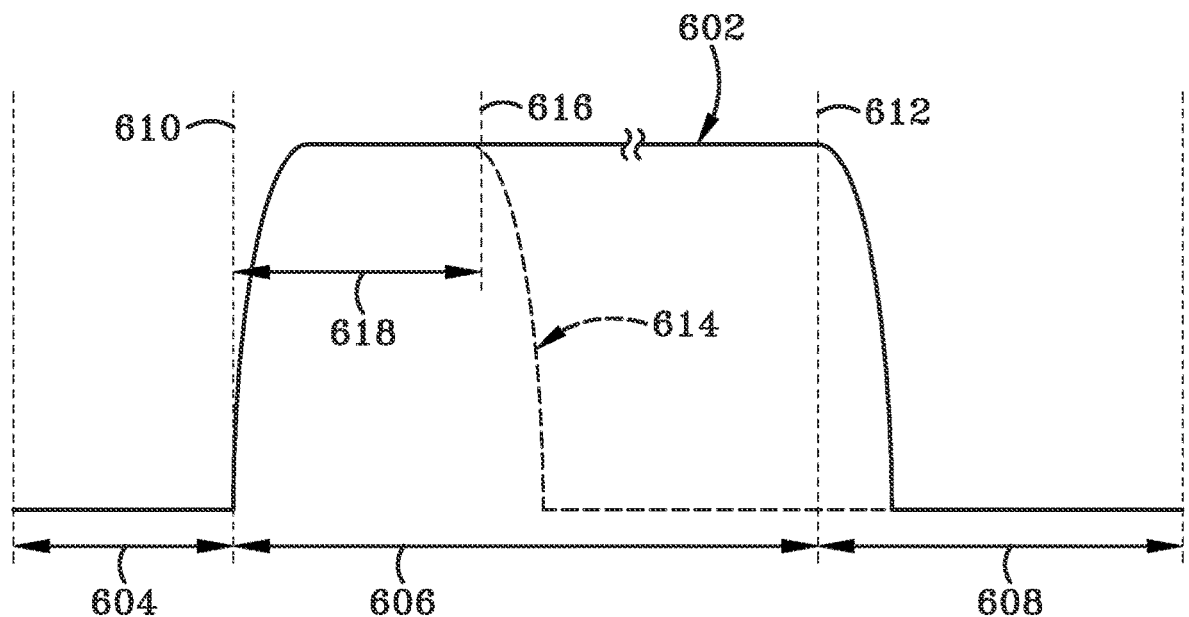
FIG. 6 (FIG. 6) depicts a waveform produced by the programmable logic device of FIG. 5.

FIG. 6 depicts an analog waveform 602 that is produced by the first DAC 448 or the second DAC 450. The analog waveform 602 includes a setup cycle 604, a pulse width or pulse cycle 606, and a hold cycle 608. The pulse cycle 606 is between a pulse rise 610 and a pulse fall 612. FIG. 6 further depicts a second waveform 614. The second waveform 614 may be an undesired waveform (i.e., an EMI waveform). The second waveform 614 includes the pulse rise 610 and includes a pulse fall 616. The second waveform 614 has a shorter pulse width 618 than the pulse cycle 606 of the analog waveform 602. Since the second waveform 614 includes a shorter pulse cycle, the second waveform 614 may not electrically initiate a pyrotechnic impulse cartridge 304 as the pyrotechnic impulse cartridge 304 may require a longer pulse cycle to fire.

Figure 7:
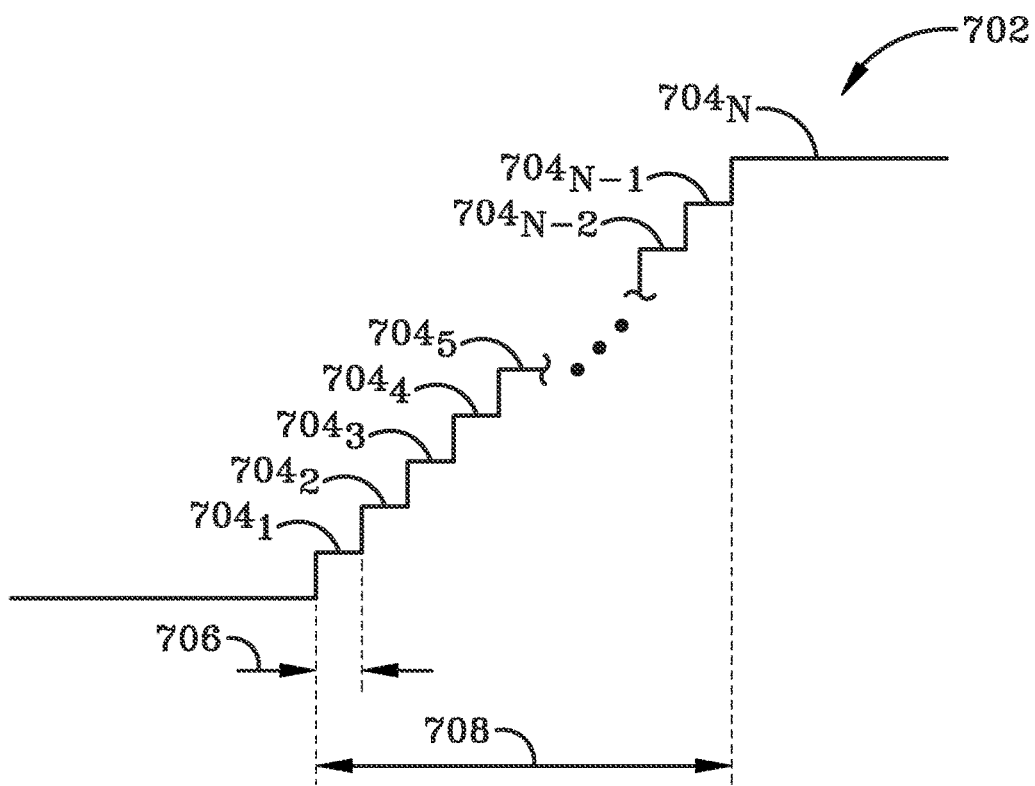
FIG. 7 (FIG. 7) depicts another waveform produced by the programmable logic device of FIG. 5.

FIG. 7 depicts an analog waveform 702 that is produced by the first DAC 448 or the second DAC 450. The analog waveform 702 may include a plurality of output voltages 704. As depicted in FIG. 7 the analog waveform 702 may include a first voltage $704_1$, a second voltage $704_2$, a third voltage $704_3$, a fourth voltage $704_4$, a fifth voltage $704_5$, ..., an N-2 voltage $704_{N-2}$, an N-1 voltage $704_{N-1}$, and an N voltage $704_N$. While the analog waveform 702 is depicted as including at least eight output voltages 704, it is understood that the analog waveform 702 may include any number of output voltages 704. The N voltage $704_N$ corresponds to a maximum output voltage of the analog waveform 702. The voltages increase after a time 706 and the time between the first voltage $704_1$ and the N voltage $704_N$ defines a rise time 708 of the analog waveform 702. The rise time 708 may be determined by the parameters stored in the edge memory 506 and the time 706 between voltages may be determined by the second timer 510. The analog waveform 702 may take a longer time to reach the N voltage $704_N$ than an undesired waveform and as such, only the analog waveform 702 may electrically initiate a pyrotechnic impulse cartridge 304 as the pyrotechnic impulse cartridge 304 may require a longer rise time to fire.

Figure 8:
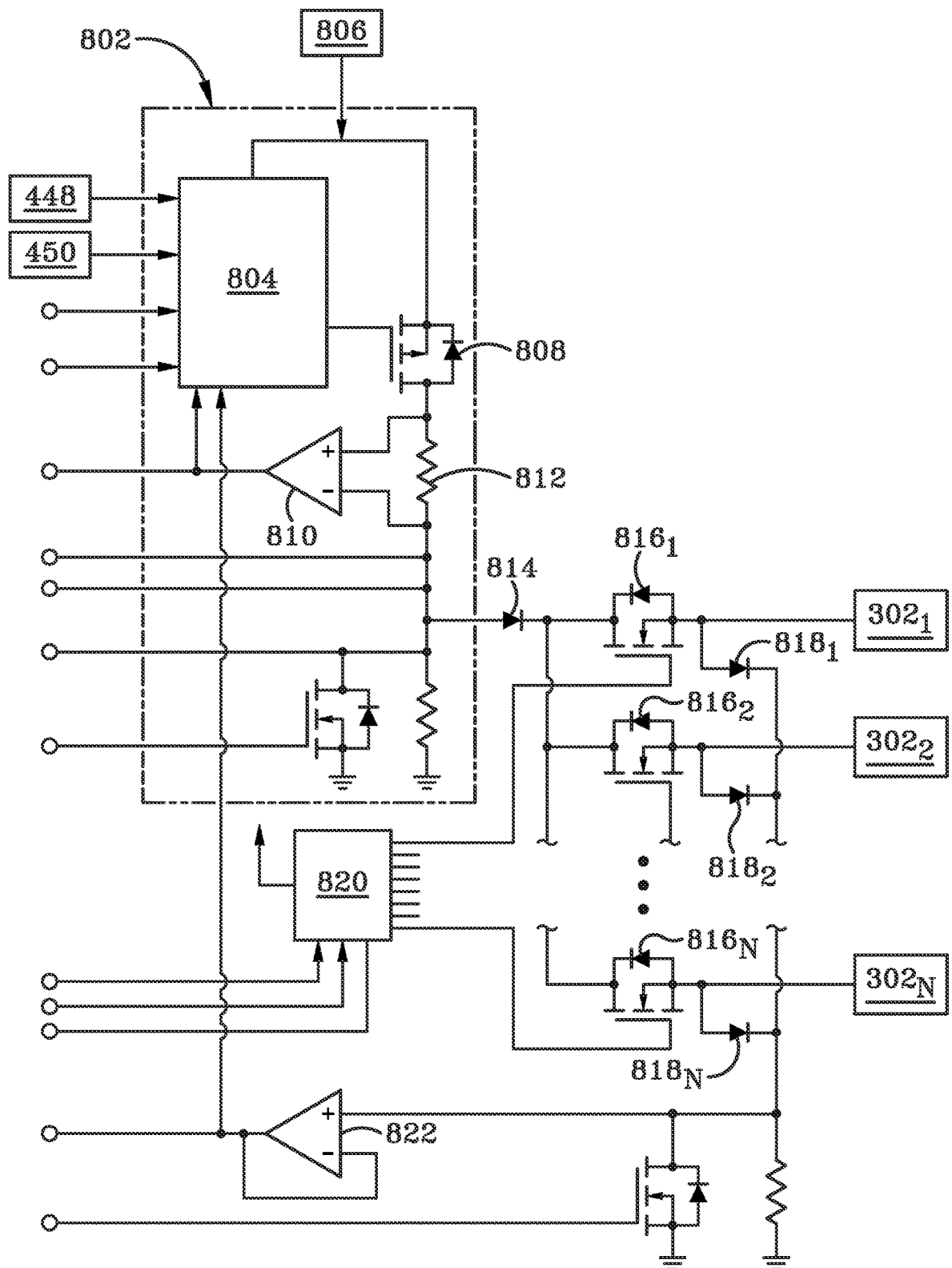
FIG. 8 (FIG. 8) depicts a fire source of the sequencer.

FIG. 8 depicts a fire source 802. As will be discussed in further detail below, the fire source 802 receives the first analog waveform from the first DAC 448 and the second analog waveform from the second DAC 450 and sends a signal corresponding to the first analog waveform and the second analog waveform to a dispenser 302 with an enabled expendable 106.

The fire source 802 includes a pulse shaping clamp 804 that is connected to the first DAC 448 and the second DAC 450 and receives the first analog waveform from the first DAC 448 and the second analog waveform from the second DAC 450. The pulse shaping clamp 804 is connected to a power source 806 and a field-effect transistor (FET) 808 of the fire source 802. The power source 806 supplies a voltage that is used to fire an expendable 106.

The FET 808 receives a voltage from the power source 806 and a set current and a set voltage from the pulse shaping clamp 804. The voltage from the power source 806 may be set to any voltage (i.e., 20 Volts (V), 25 V, 30 V, etc.). The set voltage corresponds to the voltage for the first analog waveform from the first DAC 448 at a given time and the set current corresponds to the current of the second analog waveform from the second DAC 450 at a given time. The set voltage determines a voltage that is output to a dispenser 302 with an enabled expendable 106 to electrically initiate a corresponding pyrotechnic impulse cartridge 304.

Furthermore, the FET 808 may be connected to a plurality of dispensers 302. For example, as depicted in FIG. 8, the FET 808 may be connected to a first dispenser $302_1$, a second dispenser $302_2$, ... and an N dispenser $302_N$. While FIG. 8 depicts the FET 808 as connected to at least three dispensers 302, it is understood that the FET 808 may be connected to any number of dispensers 302. Furthermore, the FET 808 may have a 100% duty cycle. That is, the FET 808 may continuously supply voltage and current to different expendables 106 without a cool down period between supplying voltage and current to different expendables 106. For example, the FET 808 may supply voltage and current to a first dispenser $302_1$ with an enabled first expendable $106_1$ that electrically initiates a first pyrotechnic impulse cartridge $304_1$ thereby firing the first expendable $106_1$. Immediately after firing the first expendable $106_1$, the FET 808 may supply current and voltage to a second dispenser $302_2$ with an enabled second expendable $106_2$ that electrically initiates a second pyrotechnic impulse cartridge $304_2$ thereby firing the second expendable $106_2$. This process may be repeated for all expendables 106 connected to the FET 808. As previously discussed, a CMDS of a legacy aircraft may have a 50% duty cycle which may require a cool down period between firing expendables 106. As such, when the sequencer unit 208 is installed on a legacy aircraft, the sequencer unit 208 may provide a legacy aircraft with the ability to continuously fire expendables 106.

The FET 808 acts a voltage controlled current source. The FET 808 may change the voltage from the power source 806 by lowering the voltage from the power source 806 to output a voltage and a current that correspond to the set voltage and the set current at the given time. The FET 808 changes the voltage from the power source 806 to the output voltage and current by changing a voltage on a voltage gate of the FET 808 thereby changing a current that flows through the FET 808 to the set current.

The FET 808 is further connected to a first amplifier 810. The first amplifier 810 is connected to a resistor 812 and the pulse shaping clamp 804. The first amplifier 810 measures the output current of the FET 808 and sends a signal indicative of the measured output current to the pulse shaping clamp 804.

The first amplifier 810 may be further connected to a diode 814 which is connected to the dispensers 302. When an expendable 106 is enabled, a corresponding dispenser 302 may begin to draw the output current from the FET 808 as a function of the output voltage and a load or resistance of an enabled expendable 106. As such, the FET 808 may output a corresponding current. As previously discussed, the output current is measured by the first amplifier 810. The resistance of an expendable 106 may be user programmable when installed correctly and may have a different resistance when installed incorrectly or when there is a fault between the fire source 802 and an expendable 106. When installed incorrectly or when there is a fault between the fire source 802 and an expendable 106 the expendable 106 may begin to draw more current which may electrically initiate a corresponding pyrotechnic impulse cartridge 304 thereby causing a misfire.

In one example, the FET 808 may output 5 V as a function of the first analog waveform to a first dispenser $302_1$ with an enabled first expendable $106_1$. In this example, the first expendable $106_1$ may have a resistance of 1 ohm (Ω). As such, the first expendable $106_1$ may begin to draw 5 amps (A) from the FET 808. Accordingly, the FET 808 may output 5 A. In another example, the FET 808 may output 6 V as a function of the second analog waveform to a second dispenser $302_2$ with an enabled second expendable $106_2$. In this example, the second expendable $106_2$ may be incorrectly wired and may have a resistance of ½ Ω. As such, the second expendable $106_2$ may begin to draw 12 A from the FET 808. Accordingly, the FET 808 may output 12 A.

The diode 814 may be further connected to a plurality of FETs 816. While FIG. 8 depicts the diode 814 as connected to at least three FETs 816 including a first FET $816_1$, a second FET $816_2$, ..., and an N FET $816_N$ it is understood that the diode 814 may be connected to any number of FETs 816. Each FET 816 may be further connected to a corresponding diode 818, a corresponding dispenser 302, and a corresponding fire MUX in a set of fire MUX 820. For example, as depicted in FIG. 8, the first FET $816_1$ may be connected to a first diode $818_1$, a first dispenser $302_1$, and a first fire MUX, the second FET $816_2$ may be connected to a second diode $818_2$, a second dispenser $302_2$, and a second fire MUX, . . . , and the N FET $816_N$ may be connected to an N diode $818_N$, an N dispenser $302_N$, and an N fire MUX. The number of FETs 816 is dependent upon the number of dispensers 302. In one example, 8 dispensers 302 may be connected to the fire source 802. In this example, eight FETs 816 are connected to the fire source 802 and each FET 816 is connected to the diode 814, a corresponding diode 818, a corresponding dispenser 302 and a corresponding fire MUX.

The diodes 818 may be further connected to a second amplifier 822. When an expendable 106 is enabled, the output voltage from the FET 808 flows through a corresponding FET 816 and a corresponding diode 818 to a dispenser 302 with the enabled expendable 106 and to the second amplifier 822. The second amplifier 822 receives the output voltage from a diode 818 and measures the output voltage. The second amplifier 822 is further connected to the pulse shaping clamp 804 and sends a signal indicative of the measured output voltage to the pulse shaping clamp 804.

The pulse shaping clamp 804 includes a first comparator. The first comparator receives the signal indicative of the measured output current from the first amplifier 810. The first comparator compares the measured output current to a threshold. If the measured current exceeds the threshold, then pulse shaping clamp 804 sends a signal to the FET 808 to output a current corresponding to the threshold. In one example, the measured output current may be 10 A. In this example, the threshold may be 6 A. As such, the first comparator may determine the measured current exceeds the threshold and sends a signal to the FET 808 to output 6 A. The FET 808 may then output 6 A. In another example, the measured output current may be 12 A and the threshold may be 5 A. In this example, the first comparator may determine the measured current exceeds the first threshold and sends a signal to the FET 808 to output 5 A. FET 808 may then output 5 A.

As previously discussed, a pyrotechnic impulse cartridge 304 may have a voltage requirement and a current requirement to electrically initiate. When the CMDS 102 attempts to fire an expendable 106, the first DAC 448 and the second DAC 450 output an analog waveform with a voltage and a current that may satisfy the requirements of a pyrotechnic impulse cartridge 304. When the measured current exceeds the first threshold and the output current of the FET 808 is adjusted to correspond to the threshold, then the voltage output to an enabled expendable 106 may no longer be set by the second DAC 450 as it is now determined as a function of the threshold. The threshold may be user programmable and may be set to any value. Furthermore, the threshold may be set to a value such that when the FET 808 is adjusted to output a current corresponding to the first threshold, a corresponding output voltage received by an enabled expendable 106 is less than the voltage requirement of a corresponding pyrotechnic impulse cartridge 304. As such, the corresponding pyrotechnic impulse cartridge 304 may not fire.

In one example, the FET 808 may initially output 5 V and 10 A, but since the first comparator determined a current output by the FET 808 exceeded the threshold, the FET 808 may adjust the current output to 6 A. In this example, an enabled expendable 106 that receives the output voltage may have a resistance of ½ Ω. As such, a dispenser 302 with the enabled expendable 106 may now receive 3 V. Furthermore, a corresponding pyrotechnic impulse cartridge 304 may require 5 V to fire. The pyrotechnic impulse cartridge 304 may now receive 3 V and as such, may not fire. In another example, the FET 808 may initially output 3 V and 12 A, but since the first comparator determined a current output by the FET 808 exceeded the threshold, the FET 808 may adjust the current output to 8 A. In this example, an enabled expendable 106 may have a resistance of ¼ Ω. As such, a dispenser 302 with the enabled expendable 106 may now receive 2 V. Furthermore, a corresponding pyrotechnic impulse cartridge 304 may require 3 V to fire. The pyrotechnic impulse cartridge 304 may now receive 2 V and as such, may not fire.

If the measured current does not exceed the threshold, then the pulse shaping clamp 804 does not send a signal to the FET 808 to adjust the output current and the FET 808 may continue to output the read current. In one example, the measured current from the first comparator may be 5 A and the first threshold may be 6 A. In this example, the first comparator may determine the measured current does not exceed the first threshold and the FET 808 may continue to output 5 A. In another example, the measured current from the first comparator may be 4 A and the first threshold may be 8 A. In this example, the first comparator may determine the measured current does not exceed the first threshold and the FET 808 may continue to output 4 A.

The pulse shaping clamp 804 may further include a second comparator. The second comparator receives the signal indicative of the measured output voltage from the second amplifier 822 and the voltage of the first analog waveform from the first DAC 448. The second comparator compares the measured voltage to the voltage of the first analog waveform.

If the measured voltage does not correspond to the voltage of the first analog waveform (i.e., the measured voltage is not the same as the voltage of the first analog waveform, the measured voltage is not within a given tolerance of the first analog waveform, etc.), then the pulse shaping clamp 804 may stop sending the set voltage and the set current to the FET 808. As a result, the FET 808 may stop outputting current and voltage to a dispenser 302 with an enabled expendable 106. Furthermore, when the measured voltage does not correspond to the voltage of the first analog waveform from the first DAC 448, then the fire source 802 may send a signal indicative of the stopped output to the second BIT MUX 472. The second BIT MUX 472 may determine if a misfire has occurred as a function of the signal indicative of the stopped output. If the second BIT MUX 472 determines that a misfire has occurred, then the second BIT MUX 472 may send a signal indicative of a misfire to the PLD 446.

If the measured voltage corresponds to the voltage of the first analog waveform from the first DAC 448, then the pulse shaping clamp 804 may continue to send the set current and the set voltage to the FET 808. As a result, a pyrotechnic impulse cartridge 304 that corresponds to an enabled expendable 106 may be electrically initiated thereby firing the enabled expendable 106.

FIG. 9 illustrates a process or a system 900 according to the present disclosure for automatically firing an expendable 106 from the platform 100. At 902, a processor that is configured to automatically fire an expendable 106 from the platform 100 (the "configured processor") receives a firing signal from the DCDU 202 or the ATDU 204 as described herein. At 904, the configured processor determines an appropriate response to receiving the signal from the DCDU 202 or the ATDU 204 as discussed herein. At 906, the configured processor enables an expendable 106 as a function of the determined appropriate response as discussed herein. At 908, the configured processor outputs a first digital waveform and a second digital waveform as a function of the determined appropriate response as discussed herein. At 910, the first DAC 448 and the second DAC 450 output a first analog waveform and a second analog waveform as a function of the first digital waveform and the second digital waveform as discussed herein. At 912, the FET 808 outputs a current and a voltage to a dispenser 302 with the enabled expendable 106 as a function of the first analog waveform and the second analog waveform as discussed herein. At 914, a first comparator determines if the output current from the FET 808 is at or below a threshold as discussed herein. At 916, if the first comparator determines the output current from the FET 808 is not at or below the threshold, then the FET 808 lowers the output voltage below a voltage requirement of a pyrotechnic impulse cartridge 304 that corresponds to the enabled expendable 106 as discussed herein. At 918, if the first comparator determines the output current is below the first threshold, then a second comparator determines if the output voltage corresponds to the voltage of the first analog waveform as discussed herein. At 920, if the second comparator determines that the output voltage does not correspond to the voltage of the first analog waveform, then the FET 808 stops outputting current and voltage to the dispenser 302 with the enabled expendable 106 as discussed herein. At 922, if the second comparator determines that the output voltage corresponds to the voltage of the first analog waveform, then the FET 808 continues to output current and voltage as a function of the first analog waveform and the second analog waveform until the expendable 106 is fired.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A method for generating a fire signal for at least one expendable countermeasure, comprising:
   receiving an input signal indicative of firing the at least one expendable countermeasure;
   generating one or more parameters of a digital waveform as a function of the input signal;
   storing in a memory the one or more parameters of the digital waveform;
   generating an analog waveform as a function of the one or more parameters of the digital waveform, wherein the analog waveform is the fire signal used for firing the at least one expendable countermeasure.

2. The method according to claim 1, further comprising:
   retrieving the one or more parameters of the digital waveform from the memory; and
   generating the digital waveform as a function of the one or more parameters.

3. The method according to claim 1, wherein the one or more parameters is defined by a user.

4. The method according to claim 1, the one or more parameters are selected to mitigate misfiring due to an undesired waveform.

5. The method according to claim 1, wherein the one or more parameters is at least one of a rise time, fall time, or a pulse cycle of the digital waveform.

6. The method according to claim 1, wherein the analog waveform has a voltage and a current and further comprising;
   determining the voltage corresponds to a voltage parameter of the one of more parameters before firing the at least one expendable countermeasure.

7. The method according to claim 1, wherein the analog waveform has a voltage and a current and further comprising;
   determining the voltage corresponds to a voltage parameter of the analog waveform; and
   in response to determining the output voltage does not correspond to the voltage parameter, reducing the output voltage.

8. The method according to claim 1, further comprising:
   generating the fire single for firing at least four countermeasures simultaneously.

9. The method according to claim 1, wherein the fire signal is generated from a sequencer unit that comprises a processing card and a sequencer card.

10. The method according to claim 9, further comprising transmitting the fire signal from the sequencer unit to a dispenser unit to dispense the at least one expendable countermeasure.

11. The method according to claim 9, further comprising replacing a legacy sequencer unit with the sequencer unit.

12. A computer program product including one or more non-transitory machine-readable mediums encoded with instructions that when executed by one or more processors cause a process to be carried out for generating a fire signal for at least one expendable countermeasure, the process comprising:
   receiving an input signal indicative of firing the at least one expendable countermeasure;
   generating one or more parameters of a digital waveform as a function of the input;
   storing in a memory the one or more parameters of the digital waveform;
   generating an analog waveform as a function of the one or more parameters of the digital waveform, wherein the analog waveform provides the fire signal for firing the at least one expendable countermeasure.

13. The computer program product according to claim 12, further comprising:
   retrieving at least one parameter of the digital waveform from a memory; and
   generating the digital waveform as a function of the at least one parameter.

14. The computer program product according to claim 12, wherein the at least one parameter is defined by a user.

15. The computer program product according to claim 12, wherein the at least one parameter is a rise time, or fall time, or a pulse cycle of the digital waveform.

16. The computer program product according to claim 12, further comprising:
   outputting, with the circuit card, a voltage to the countermeasure;
   determining the output voltage corresponds to a voltage parameter of the analog waveform; and
   in response to determining the output voltage corresponds to the voltage parameter, generating the fire signal for firing the at least one expendable countermeasure.

17. The computer program product according to claim 12, further comprising:
   outputting a voltage to the at least one expendable countermeasure;
   determining the output voltage corresponds to a voltage parameter of the analog waveform; and
   in response to determining the output voltage does not correspond to the voltage parameter, reducing the output voltage.

18. The computer program product according to claim 12, further comprising:
   generating the fire signal to fire a plurality countermeasures substantially simultaneously.

19. The computer program product according to claim 12, wherein the fire signal is generated from a sequencer unit that comprises a processing card and a sequencer card.

20. The computer program product according to claim 19, further comprising transmitting the fire signal from the sequencer unit to a dispenser unit to dispense the at least one expendable countermeasure.

* * * * *